United States Patent

Steppan et al.

[15] 3,635,720

[45] Jan. 18, 1972

[54] LIGHT-SENSITIVE FILM ELEMENT COMPRISING A POLYESTER OF A POLYHYDRIC ALCOHOL AND β-SUBSTITUTED-α-CYANACRYLIC ACID

[72] Inventors: Hartmut Steppan, Wiesbaden; Albrecht Moschel, Kelkheim Taunus; Walter Luders, Neu-Isenburg, all of Germany

[73] Assignee: Kalle Aktiengesellschaft, Rheingaustrasse, Germany

[22] Filed: Mar. 19, 1969

[21] Appl. No.: 808,666

[30] Foreign Application Priority Data

Mar. 20, 1968 Germany ........................P 17 72 003.5

[52] U.S. Cl. ........................................................96/115
[51] Int. Cl. ........................................................G03c 1/68
[58] Field of Search ........................................96/115, 115 P

[56] References Cited

UNITED STATES PATENTS

| | | | |
|---|---|---|---|
| 3,255,006 | 6/1966 | Bailey | 96/115 P |
| 3,455,689 | 7/1969 | Laridon et al. | 96/115 |
| 3,278,305 | 10/1966 | Laridon et al. | 96/115 |
| 3,031,301 | 4/1962 | Agens | 96/115 P |
| 3,036,913 | 5/1962 | Burg | 96/115 P |

*Primary Examiner*—Norman G. Torchin
*Assistant Examiner*—Edward C. Kimlin
*Attorney*—Curtis, Morris and Safford

[57] ABSTRACT

Manufacture of a light-sensitive layer of polymers capable of being cross-linked under the action of light. Polymers of this type are esterification products of polyhydric alcohols with unsaturated carboxylic acids having at least one carbon-carbon double bond conjugated with the carboxyl group. The light-sensitive layer is especially suitable for the manufacture of printing plates and etch resists.

9 Claims, No Drawings

LIGHT-SENSITIVE FILM ELEMENT COMPRISING A POLYESTER OF A POLYHYDRIC ALCOHOL AND β-SUBSTITUTED-α-CYANACRYLIC ACID

It is known to incorporate into polymers groupings which are dimerizable, or polymerizable in short chains, by means of light and which in this manner render the polymer photo-cross-linkable. Such polymers which are photo-cross-linkable have found use in light-sensitive copying layers for the manufacture of tanned images, of printing plates and especially of etching resists of the most diverse kind. Cinnamic acid esters of polyalcohols, for example of fully or partially saponified polyvinyl esters and of cellulose, have achieved particular significance as photo-cross-linkable polymers.

Since the esters or amides of cinnamic acid are only of very low sensitivity towards the light sources usual in copying technology, especially when using the usual copying frames with a glass cover plate, there has been no lack of efforts to increase their light sensitivity towards longer wavelength light by sensibilization or to replace these cinnamic acid derivatives by more light-sensitive products. Admittedly the light sensitivity of the copying layers is widened in the direction of longer wavelengths through the addition of sensitizers, but on the other hand the complete cross-linking by light of the deeper parts of the layer is rendered more difficult since the sensitizers as a rule are only bleached slightly or not at all on exposure to light and since they simultaneously act as filters. Since the sensitizers are added to the copying layers in amounts of up to about 10 percent the etching resistance of the copying layers can thereby be reduced since one is generally dealing with easily soluble low-molecular substances which are frequently capable of salt formation.

A need therefore exists for copying layers of photo-cross-linkable polymers which are already so sensitive to light without a sensitizer that they can be processed using the light sources usual in copying technology.

Such copying layers are already described in U.S. Pat. No. 3,257,664 according to which the cinnamic acid component of the light-sensitive polyvinyl cinnamate was replaced by cinnamylideneacetic acid which contains a longer conjugated system. This type of polymer shows relatively good light sensitivity already in the longer wavelength UV range but tends towards premature cross-linking on storage.

Further, reaction products of polymers containing hydroxyl groups with phthalic anhydride derivatives are known from U.S. Pat. No. 2,861,057, that is to say half-esters of 3- or 4-(α-cyancinnamido)-phthalic acid with polymeric alcohols.

Furthermore photo-cross-linkable polymers are known from U.S. Pat. No. 2,824,084 which are obtained by reaction of styrene/maleic anhydride copolymers with 4-hydroxyethoxy-α-cyanocinnamic acid or its lower alkyl esters.

The photo-cross-linkable polymers described in the two latter U.S. Pat. specifications, however, suffer from the disadvantage that the density of light-sensitive structures can, as a result of the structure of the polymers, not be made as high as is desirable for achieving as high a light sensitivity of the polymer as possible. Furthermore the light-sensitive groupings are bonded to the main chain of the polymer via relatively long chain intermediate links, which is a disadvantage in respect of the desirable lowest possible tendency to swelling of the polymers cross-linked by light in developer solutions.

The subject of the invention is a light-sensitive layer which consists of an esterification product of a polyhydric alcohol with unsaturated carboxylic acid which possesses one or more carbon-carbon double bonds conjugated with the carboxyl group, or which contains this esterification product characterized in that the light-sensitive layer contains one or more photo-cross-linkable esters, of β-substituted α-cyanacrylic acids with polyfunctional aliphatic or araliphatic hydroxyl compounds, of which the carbon chain may be interrupted once or several times by an oxygen atom or an alkylamino, acetal, ester, carbonic acid ester, urethane, amido or urea group or be bridged once or several times by an acetal group, with the above-mentioned esters having average molecular weights of 500 to 5,000,000, preferably 5,000 to 2,000,000, and containing a. the group $$X\!-\!\left(\underset{Y}{C}\!=\!\underset{Y}{C}\right)_{n}\!-\!\underset{Y}{C}\!=\!\underset{CN}{C}\!-\!CO\!-,$$

in which Y denotes a hydrogen atom or an aliphatic alkyl residue having one to four carbon atoms, X denotes an aromatic, cycloaliphatic or heterocyclic residue in each case containing five to 14 ring members which may be substituted once or twice by an alkyl or alkoxy residue having in each case one to six carbon atoms, a halogen atom, a phenyl residue, a dialkylamino group of which the alkyl residues each contain one to four carbon atoms, or a methylenedioxy, carboxyl or carboxylate group, and *n* denotes 0 or an integer from 1 to 3, in an amount of 10 to 100, preferably 40 to 98 percent, b. the group R′—COO—in which R′ denotes an aliphatic residue having one to eight carbon atoms or an aromatic residue having six to eight carbon atoms, in an amount of 0 to 85, preferably 2 to 50, percent and c. free hydroxyl groups in an amount of 0 to 50, preferably 1 to 30, percent, with the groups mentioned under (a) to (c) adding up to 100 percent.

The photo-cross-linkable esters used in accordance with the invention are manufactured by reacting at least one acid chloride of formula (I)

$$X\!-\!\left(\underset{Y}{C}\!=\!\underset{Y}{C}\right)_{n}\!-\!\underset{Y}{C}\!=\!\underset{CN}{C}\!-\!COCl \qquad (I)$$

in which X, Y and *n* have the above-mentioned significance, with polyfunctional aliphatic or araliphatic hydroxyl compounds of which the carbon chain may be interrupted once or several times by an oxygen atom, or an alkylamino, acetal, ester, carbonic acid ester, urethane or urea group or be bridged once or several times by an acetal group.

The photo-cross-linkable esters are manufactured in polar solvents miscible with water in the presence of tertiary amines, which may also be solvents, in a temperature range of −20° to +100° C., preferably +20° to +80° C.

Cyclic ethers, for example tetrahydrofurane and dioxane, and N-substituted amides of lower carboxylic acids, for example dimethylformamide are in particular used as polar solvents miscible with water.

Low-molecular aliphatic, cycloaliphatic and aromatic amines are employed as tertiary amines, for example trimethylamine, triethylamine, tri-n-propylamine, dimethylcyclohexylamine, N-methyl-piperidine, N-methylmorpholine, pyridine or mixtures thereof. A particularly preferred position is occupied by pyridine which can serve both as a solvent and also as a tertiary amine.

Furthermore, particularly nucleophilic tertiary amines can be added to the tertiary amine or to the mixture of tertiary amine and the above-mentioned polar solvents in amounts of 0.01 to 5, preferably 0.05 to 0.5, percent by weight, relative to the solvent, in order to accelerate the esterification reaction. In particular, aliphatic tertiary amines with alkyl residues containing one to three carbon atoms, bicyclic tertiary amines with seven to 10 ring members and diamines of formula (II) $(CH_3)_2N—A—N(CH_3)_2$ are used in which A denotes a bivalent hydrocarbon residue having two to six, preferably four to six, carbon atoms, of which the carbon chain may be interrupted by one or more oxygen atoms or methylamino groups. Trimethylamine, 1,4-diazabicyclo-[2.2.2]-octane, N,N′-tetramethyl-1,4-diaminobutane, N,N′-tetramethyl-1,4-diaminobutene-(2) and 2,2′-bis(dimethylamino)-diethyl ester may be mentioned.

By polyfunctional hydroxyl compounds there are understood both low-molecular aliphatic trihydric or polyhydric alcohols and their alkoxylation products, low-molecular polyether-alcohols and low-molecular telomers of allyl alcohol with monomers containing vinyl groups, and high-molecular compounds with a large number of hydroxyl groups, especially polyvinyl alcohols, vinyl alcohol copolymers with vinyl esters or olefines, cellulose and cellulose esters, condensation products of bisphenol A with epichlorhydrin, condensation products of glycid and polyfunctional phenols as well as polyamines, polyacetals, polyesters, polyurethanes, polyamides and polyureas containing hydroxyl groups.

Possible polyfunctional hydroxyl compounds are first of all aliphatic triols and polyols, for example glycerine, trimethylolethane, trimethylolpropane, pentaerythritol, pentites and hexites, and also polyether-alcohols, for example dipentaerythritol, as well as alkoxylation products of the above-mentioned alcohols, for example propoxylated trimethylolpropane of molecular weight 300 to 750, propoxylated pentaerythritol of molecular weight 380 to 750 and propoxylated pentites and hexites.

Further hydroxyl compounds which are of interest are compounds which can be obtained by telomerization of allyl alcohol with monomers containing vinyl groups, for example telomers of allyl alcohol with styrene of average molecular weights 1,000 to 5,000, preferably 1,200 to 2,000.

Instead of the low-molecular polyfunctional hydroxyl compounds mentioned, high-molecular compounds carrying a large number of hydroxyl groups are even more suitable, with polymeric hydroxyl compounds with average molecular weights of above 5,000 being preferred. The low-molecular hydroxyl compounds can preferably be used together with high-molecular types.

Compounds of particularly great importance are polyvinyl alcohols as well as copolymers of vinyl alcohol with vinyl acylates which are produced by incomplete saponification of polyvinyl acylates or subsequent acylation of polyvinyl alcohols with acid chlorides of monobasic unbranched or branched aliphatic carboxylic acids having two to eight, preferably two to three carbon atoms. In particular, polyvinyl alcohols are used of which a 4 percent by weight solution in water or in a water/methanol mixture (weight ratio 1:1) has a viscosity of 2 to 25 cp./20° C. and of which the degree of saponification is 45 to 99, preferably 60 to 90, percent. Polyvinyl alcohols of which the 4 percent by weight solutions in water or in a water/methanol mixture (weight ratio 1:1) have a viscosity of 3 to 18 cp./20° C. and which have a degree of saponification of 60 to 90 percent have herein proved very particularly advantageous.

Further suitable polyfunctional hydroxyl compounds are vinyl alcohol/ethylene copolymers which can also further contain a residual proportion of copolymerized vinyl acetate. Products of this nature are obtained by copolymerization of vinyl acetate with ethylene and subsequent saponification. Products containing 0.1 to 25 mol percent of ethylene have above all proved very suitable.

Cellulose can also be used as the hydroxyl compound, especially those types of cellulose which are partially acylated. Cellulose acetates having an acetyl content of 20 to 40, preferably 25 to 35, percent are particularly suitable.

Further hydroxyl compounds of significance are polyfunctional mixed aliphatic-aromatic ether-alcohols, that is to say condensation products of bisphenols, preferably bisphenol A, and epichlorhydrin having average molecular weights of 5,000 to 200,000, preferably of 8,000 to 100,000, as well as reaction products of epoxide resins of bisphenol A and epichlorhydrin with average molecular weights of up to about 8,000 with polyhydric alcohols, for example sorbitol, or with aliphatic hydroxydicarboxylic acids, for example tartaric acid.

Condensation products of bisphenol A and epichlorhydrin of formula (III)

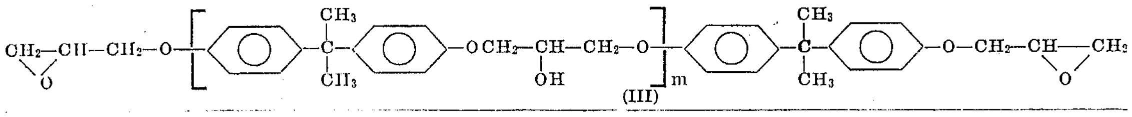

(III)

in which $m$ denotes an integer from 15 to 700, preferably from 25 to 350, should here especially be mentioned.

Further, condensation products of glycid with polyfunctional phenols, that is to say compounds of formula (IV)

(IV)

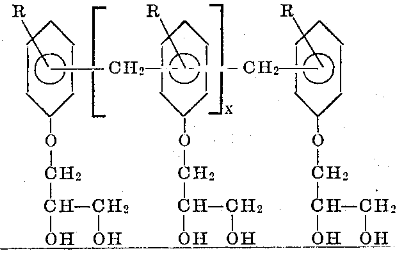

are suitable in which R denotes a hydrogen atom or a methyl group and X denotes an integer from 1 to 20, preferably from 2 to 10.

Further, compounds which are produced by incomplete reaction of compounds of formula (III) with 0.1 to 60 equivalent percent, relative to the epoxide equivalent of the compounds of formula (III), of an aliphatic, cycloaliphatic or aromatic acid anhydride at 140° to 160° C. should be mentioned as compounds containing hydroxyl groups. Maleic anhydride, hexahydrophthalic anhydride, methylanadic anhydride*(*The product of the diene synthesis of maleit anhydride and methylcyclo-pentadiene.) and phthalic anhydride are above all used as acid anhydrides. Despite their molecular weight being considerably higher than that of the starting compounds, the epoxide resins manufactured in this way still show good solubility in pyridine and can be acylated at the numerous free hydroxyl groups.

As polyfunctional hydroxyl compounds it is further possible to use compounds carrying OH groups of which the carbon chain is interrupted once or several times by an alkylamino, acetal, ester, carbonic acid ester, urethane, amido or urea group or is bridged once or several times by a cyclic acetal group, that is to say by the groups

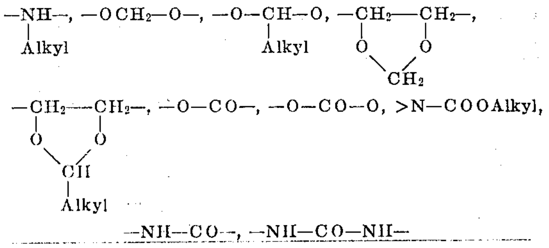

wherein "Alkyl" denotes aliphatic alkyl residues having one to six, preferably one to four, carbon atoms.

Polyesters, polyurethanes and polyamides containing hydroxyl groups should above all be mentioned.

By acid chlorides of formula (I) there are to be understood β-substituted α-cyanacrylic acid chlorides and their vinylogues, especially unsubstituted and nuclear-substituted benzylidenecyanacetic acid chloride and its homologues having one to three vinylene groups, that is to say, compounds of formula (I) in which Y denotes hydrogen and X denotes a phenyl residue which is unsubstituted or is substituted once or twice by an alkyl or alkoxy residue having in each case one to four carbon atoms, a halogen atom, preferably chlorine atom, a dimethylamino group of which the alkyl residues each contain one to four carbon atoms, a phenyl residue or a methylenedioxy residue.

The use of $\beta$-substituted $\alpha$-cyanacrylic acid chlorides of formula (V)

(V) 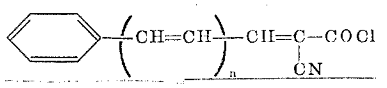

in which $n$ denotes zero or 1, that is to say benzylidene-$\alpha$-cyanacetic acid chloride and cinnamylidene-$\alpha$-cyanacetic acid chloride is particularly preferred.

In the manufacture of the copying layers according to the invention the use of reaction products of the above-mentioned two acid chlorides with polyvinyl alcohols of which a 4 percent by weight solution in water or in a water/methanol mixture (weight ratio 1:1) has a viscosity of 2 to 25 cp./20° C. and of which the degree of saponification is 45 to 99, preferably 60 to 90, percent is of particular advantage since these products are simple and cheap to manufacture. Furthermore the cinnamylidene-$\alpha$-cyanacetic acid esters of the above-mentioned polyvinyl alcohols are to a particular extent distinguished by the fact that they show good light sensitivity without addition of sensitizers and that after cross-linking by the action of light they show a very low swellability in the developer solutions.

Suitable nuclear-substituted derivatives of benzylidene-$\alpha$-cyanacetic acid chloride and the cinnamylidene-$\alpha$-cyanacetic acid chloride are for example acid chlorides of 4-methylbenzylidene-$\alpha$-cyanacetic acid, 3-methylbenzylidene-$\alpha$-cyanacetic acid, 2-methylbenzylidene-$\alpha$-cyanacetic acid, 4-ethylbenzylidene-$\alpha$-cyanacetic acid, 4-isopropylbenzylidene-$\alpha$-cyannacetic acid, 4-chlorobenzylidene-$\alpha$-cyanacetic acid, 3-chlorobenzylidene-$\alpha$-cyanacetic acid, 2,4-dichlorobenzylidene-$\alpha$-cyanacetic acid, 4-methoxybenzylidene-$\alpha$-cyanacetic acid, 3-methoxybenzylidene-$\alpha$-cyanacetic acid, 2-methoxybenzylidene-$\alpha$-cyanacetic acid, 3,4-methylenedioxybenzylidene-$\alpha$-cyanacetic acid, 4-phenylbenzylidene-$\alpha$-cyanacetic acid as well as 4-methylcinnamylidene-$\alpha$-cyanacetic acid, 3-methylcinnamylidene-$\alpha$-cyanacetic acid, 2-methylcinnamylidene-$\alpha$-cyanacetic acid, 4-ethylcinnamylidene-$\alpha$-cyanacetic acid, 4-isopropyl-cinnamylidene-$\alpha$-cyanacetic acid, 4-chlorocinnamylidene-$\alpha$-cyanacetic acid, 3-chlorocinnamylidene-$\alpha$-cyanacetic acid, 2-chloro-cinnamylidene-$\alpha$-cyanacetic acid, 4-methoxycinnamylidene-$\alpha$-cyanacetic acid, 3-methoxycinnamylidene-$\alpha$-cyanacetic acid, and 3,4-methylenedioxycinnamylidene-$\alpha$-cyanacetic acid.

Acid chlorides of formula (I) have furthermore proved suitable in which $n$ is zero and X represents a higher condensed aromatic residue having 10 carbon atoms, especially acid chlorides of 1-naphthylidene-$\alpha$-cyanacetic acid and 2-naphthylidene-$\alpha$-cyanacetic acid.

Acid chlorides of formula (I) in which $n$ is zero, 1 or 2 and X represents an unsaturated cycloaliphatic residue or a heterocyclic residue containing nitrogen, oxygen or sulphur are furthermore of interest.

Acid chlorides to be particularly mentioned are those of formula (I) wherein $n$=zero or 1 and X denotes a furane residue, for example furanylidene-$\alpha$-cyanacetic acid chloride as well as $\alpha$-cyano-$\omega$-furyldienecarboxylic acid chloride.

Among the acid chlorides containing nitrogen vinylogous isoindolinyl compounds should above all be mentioned, that is to say compounds of formula (I) in which X denotes the heterocyclic residue

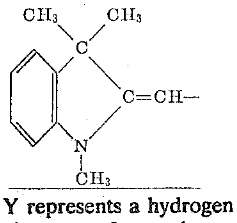

$n$ is zero or 1 and Y represents a hydrogen atom or a lower aliphatic residue having one to four carbon atoms.

The acid chlorides of formula (I) are employed either by themselves or mixed with one another and also mixed with 0.1 to 20, preferably 1 to 10, mol percent, relative to acid chlorides of formula (I), of nonphotoactive acid chlorides of aliphatic carboxylic acids having two to eight carbon atoms or of aromatic carboxylic acids having seven to 10 carbon atoms. Acid chlorides of branched aliphatic monocarboxylic acids, especially of 2-ethyl-hexanecarboxylic acid are herein particularly suitable. The reaction of the above-mentioned nonphotoactive acid chlorides with the polyfunctional hydroxyl compounds can take place both simultaneously with the reaction of the acid chlorides of formula (I) and also before or afterwards. A favorable effect can be exerted on the solubility, film forming tendency and oleophilic character of the esters which are photo-cross-linkable by using this procedure.

The acid chlorides of formula (I) are manufactured in a known manner by reacting the free carboxylic acids with thionyl chloride as the halogenating agent and solvent, and subsequent precipitation by dilution with low-boiling aliphatic hydrocarbons such as pentane, hexane, heptane or octane or their mixtures.

The free carboxylic acids are accessible by condensation of the corresponding aldehydes with cyanacetic acid in an aqueous alkaline medium (compare Organic Synthesis collected Volume I, page 181). They are further accessible by condensation of the corresponding aldehydes with cyanacetic acid esters and careful alkaline saponification of the resulting esters (compare M. Coenen and M. Pestemer, Zeitschrift für Elektrochemie, 57, page 791 (1953)).

A particularly preferred embodiment for the manufacture of the photo-cross-linkable esters consists of first dissolving or swelling the compound containing hydroxyl groups in a 10-fold to 40-fold quantity of pyridine, adding a strongly nucleophilic amine, for example 1,4-diazabicyclo-[2.2.2]-octane at a concentration of 0.01 to 1, preferably 0.1 to 0.5, percent by weight relative to pyridine, and adding an acid chloride of formula (I) either in portions in the pure state or dissolved in a solvent which is inert but miscible with water and pyridine, for example dioxane, in a temperature range of between room temperature and 70° C., preferably between +45° and +60° C. After completion of the reaction the pyridinium chloride which has separated out is filtered off and the filtrate is allowed to run into the 10-fold to 20-fold quantity of water while stirring, in the course of which the compound either separates out directly in a filterable form or can be obtained by extraction of the aqueous solution or dispersion. The reaction products thus obtained are largely purified from impurities, by products and unreacted compounds containing hydroxyl groups by washing with water. Drying is effected under mild conditions under reduced pressure in the presence of conventional drying agents, for example phosphorus pentoxide.

The quantity ratio of the acid chloride of formula (I) and the polyfunctional hydroxyl compound may lie within wide limits which are determined by the requisite light sensitivity of the products and lies in the range of 10.0 to 120, preferably 40.0 to 98.0, mol percent of acid chloride relative to the hydroxyl groups present.

The photo-cross-linkable esters must be manufactured with exclusion of short wavelength light in order to avoid premature cross-linking, that is to say in the absence of light in the wavelength range of 2,000 to 6,000 A.

The copying layer according to the invention can consist of only one or of several of the photo-cross-linkable polymers which have been mentioned; it can, however, also further contain a series of additives which modify the properties of the layer.

The coping layer according to the invention is employed in very diverse ways. Thus it is used in the photomechanical application of drawings and information on supports, for example consisting of metal, plastics, ceramics and glass. After the photomechanical transfer stage the layer material is dissolved out of the unexposed zones by means of a developer solution and an insoluble polymer image remains in the parts of the layer exposed to light which can be directly utilized, for example as a result of its color (tanned image, relief image) or its oleophilic character and/or abrasion resistance (planographic printing plates, screen printing). It is also possible to utilize the differing softening characteristics of exposed and unexposed parts of the layer by warming or by solvents for the manufacture of copies, and the transfer of unexposed copying layer onto a receiving sheet is also a possibility.

Because of the high chemical resistance of the layer cross-linked by light the support can however also be worn away by chemical or electrolytic etching in the areas freed of hardened copying layer, or metals can be electrolytically deposited (electroplating) in these areas.

Printing plates for relief and intaglio printing, multimetal plates, for example bimetallic plates of the copper/aluminum or brass/chromium type, or trimetallic plates of the aluminum/copper/chromium type, printed circuits, nameplates and type shields (sic), decorative patterns for industrial art purposes and shaped articles by chemical milling can be manufactured by these working stages.

Preferred fields of application for the light-sensitive copying layer according to the invention are the manufacture of printing plates and the manufacture of etch resists.

In order to apply the copying layer to the support, the photo-cross-linkable polymers are dissolved and applied to the support, optionally after addition of additives. The coating is effected by casting and allowing to drip off, by dipping, by roller application, by centrifugal application, by spraying or by any other coating technique. The layer thicknesses are generally between 0.1 and 50 m$\mu$. The thicker layers of this range can be built up by repeated application of thin layers.

Solvents used for preparing the coating solutions are polar solvents, especially cyclic ethers, for example tetrahydrofurane and dioxane, lactones, for example butyrolactone, amides of lower carboxylic acids, for example dimethylformamide, cyclic ketones, for example cyclohexanone, glycol and diglycol diethers, for example glycol dimethyl ether and diethylene glycol dimethyl ether, and glycol esters, for example methyl glycol acetate as well as mixtures of these solvents. The above-mentioned solvents, which in themselves are good solvents for the photo-cross-linkable esters can also be used mixed with solvents which in themselves are only poor solvents for the polymer.

The coatings are dried onto the support by treatment with warm air, with the temperature not exceeding 100° C.

Possible additives to the photo-cross-linkable esters used in accordance with the invention are a large number of substances. Thus plasticizers, wetting agents, stabilizers against oxidation and thermal degradation, sensitizers, dyestuffs, colorless and colored pigments of inorganic or organic nature, glass powder, salts, for example aluminum salts of fatty acids, phosphors and polymers which are not light-sensitive and are compatible with the photo-cross-linkable esters may be used. Possible polymers are for example vinyl polymers such as polyvinyl acetate or copolymers of vinyl acetate with other monomers, epoxide resins, polyamides, polyurethanes and cellulose esters.

The sum of all additives is as a rule not more than 50 percent of the sum of all constituents of the layer but can in special cases also be higher. Copying layers which do not contain any additives or contain not more than 20 percent of additives relative to all constituents of the layers are preferred. When choosing the additives care must be taken that these do not absorb, or absorb as little as possible, in the wavelength range which is applicable to bringing about the light reaction for the light-sensitive constituents of the copying layer.

It is also possible to combine the photo-cross-linkable esters used in accordance with the invention with known photo-cross-linkable polymers, for example with polymers which carry cinnamic acid ester, chalcone, coumarine, azide, or sulphonazide groups. They can further be combined with diazo compounds, for example with diazo resins, or with photopolymer layers.

A large number of the light sources usual in copying technology can be used for cross-linking the polymers imagewise. Light sources which particularly copiously emit electromagnetic radiation in the wavelength range of 300 to 700 m$\mu$, preferably of 300 to 500 m$\mu$, are preferred. As examples there may be mentioned, carbon arc lamps, xenon impulse lamps, mercury vapor lamps, actinic and superactinic fluorescent lamps; sunlight is also suitable. Incandescent lamps (tungsten) can also be employed in some cases. The same is true for Laser light.

The copying layer according to the invention is exposed imagewise for different lengths of time and in different ways depending on the composition of the layer, the layer thickness, the support and the intended result. The practical possibilities range from contact exposure in a vacuum copying frame with a glass or plastic film cover to exposure by means of a projector, optionally with enlargement or reduction. The duration of exposure is accordingly from a few seconds to several hours. If high image resolution is considered important, it is advisable to use imagewise exposure of the copying layer in close contact with the emulsion layer of the original.

In order to remove the uncross-linked parts of the layer which were not irradiated on image exposure, the copying material (support and copying layer) is treated with a developer until the support has been laid bare in these parts.

Anhydrous organic solvents, or organic solvents of low water content, or mixtures of anhydrous organic solvents or organic solvents of low water content, which are also employed in the manufacture of the coating solutions, are used as the developer. Preferentially suitable materials are cyclic ethers, for example tetrahydrofurane and dioxane, glycol esters, for example methylglycol acetate, cyclic ketones, for example cyclohexanone, cyclic acetals, for example dioxolane, glycol and diglycol diethers, for example ethylene glycol dimethyl ether and diethylene glycol dimethyl ether, or mixtures of these solvents. For better control of the developing it is appropriate further to add to the above-mentioned solvents, which by themselves produce very rapid development, solvents which by themselves cause slower development or practically none at all. Chlorobenzene, toluene, xylene, butyl acetate, ethylene glycol diethyl ether and diethylene glycol diethyl ether are, for example, well suited to this purpose.

The development is preferably effected by dipping the copying material into the agitated developer. It is advantageous to spray the developed plate with fresh developer before drying. It is also possible to effect the development by wiping over manually with the developer; on careless working there is admittedly the danger, when developing by wiping over manually, that parts of the image which have been slightly swollen by developer will be damaged. The danger of damage of the copying material is on the other hand reduced if copying layers of good abrasion resistance when in a moist state due to the developer are used.

The following process has proved particularly suitable for developing the copying materials: the copying material exposed imagewise is dipped in the agitated developer until the unexposed parts of the layer have been completely dissolved away. The copying material is then immediately sprayed with fresh developer and dipped into a bath which withdraws from the hardened copying layer any solvent which may have migrated in from the developer. Lower aliphatic alcohols, for example ethanol, are well suited to this purpose. It is however also possible to rinse with water or to blow over the material with a jet of air mixed with water. The resulting copy is finally dried.

Good results are also achieved if benzyl alcohol by itself is used as the developer, even when development is effected by light wiping-over with a swab moistened with this solvent.

If the copying layer initially did not contain any dyestuff, the image can now be rendered visible by dipping it into a solvent exerting a slight swelling effect on the cross-linked layer and which contains a dyestuff. The copying material can however also be directly after exposure dipped into a solvent which contains a dyestuff dissolved therein, the solvent being so chosen that it only slightly swells the unexposed parts of the layer without dissolving them. The positive copy of a positive (single copy) is thus obtained.

In order to manufacture positive planographic printing plates from a negative original the support (for example aluminum) which has been laid bare can, if necessary, be rendered hydrophilic by a known agent for conferring hydrophilic properties, for example gum arabic, which optionally further contains phosphoric acid and fluoride ions. Thereafter the plate is inked with a greasy printing ink which is accepted well by the image pattern which has been cross-linked by light.

If a positive printing plate of a positive original is required then the support which has been laid bare can for example be copper-plated. The image pattern is subsequently removed and the aluminum support which has now been laid bare is rendered hydrophilic if necessary.

If a multimetal plate of the iron/copper/chromium, aluminum/copper/chromium or brass/chromium type was used as the support for the copying layer according to the invention, with the last-named metal forming the upper layer, then the chromium layer can be removed by means of one of the known chromium etching compositions after the development described above, and the olephilic copper or brass layer can be laid bare. After removing the cross-linked copying layer from the chromium layer (decoating) multimetal printing plates of high productivity, that is to say positive printing plates of positive originals, result.

If an aluminum/copper plate with copper as the upper layer was used as the support, then on working analogously but using a copper etching liquid the positive printing plate of a negative original results.

Printed circuits are obtained by suing a metal layer, applied to a nonconductor, as the support for the copying layer. After copying a circuit diagram onto it, development is effected as described above and the metal layer is subsequently worn away down to the nonconductor in the parts which have been laid bare.

The good resistance to etching and good resistance to flank protection agents makes the copying layer according to the invention appear particularly suitable for the manufacture of relief printing plates by the powderless etching process. It is not necessary to burn in the resist before etching. Zinc, magnesium and copper can for example be used as supports.

The copying layer according to the invention can also be used for the manufacture of printing plates for halftone gravure printing.

In order to improve the adhesion of the copying layer according to the invention on the supports it is generally advantageous to pretreat these chemically or mechanically and thus to produce a suitable adhesion surface.

It is not necessary to use the copying material consisting of the copying layer according to the invention and a support directly after manufacture. It can be stored for months in the unexposed state without becoming unusable.

Example 1 a. Manufacture of the photo-cross-linkable ester:

Fourteen g. of a dried polyvinyl alcohol, of which a 4 percent by weight aqueous solution has a viscosity of 4 cp./20° C., and which has a degree of saponification of 88 percent, are swollen overnight at 100° C. in 125 ml. of anhydrous pyridine and subsequently diluted with a further 125 ml. of pyridine. After cooling the mixture to 50° C. 2 g. of diazabicyclooctane dissolved in 12.5 ml. of pyridine are added and 25.5 g. of benzylidene cyanacetic acid chloride are subsequently added in portions at this temperature. After stirring for a further 8 hours the rather viscous mass is diluted with acetone to twice its volume, the pyridinium chloride is filtered off, and the filtrate is run into a 10-fold quantity of water while stirring. The resulting product is filtered off, very thoroughly washed with water and subsequently dried at 30° C. under reduced pressure over $P_2O_5$. 38.7 g. of a fibrous product are obtained which in the IR-spectrum show strong bands at 1,710 (ester), 1,600 (aromatic structure) and 2,220 $cm^{-1}$ (nitrile) and in the UV-spectrum show a maximum at 302 mμ with an extinction of $E^{1\%}_{1 cm.}=537$ (dioxane.)

b. Manufacture of the Copying Material:

A 2 mm. thick zinc plate which has been slightly roughened by brief dipping in 5 percent strength by weight aqueous nitric acid is coated with a 7 percent strength by weight solution of the polyvinylbenzylidene-α-cyanacetate, manufactured according to (a), in a mixture of ethylene glycol monomethyl ether acetate and cyclohexanone (weight ratio 1:1) on a centrifugal plate coater. The plate is first dried with a warm air blower and subsequently for 2 minutes at 80° C. in a drying cabinet.

c. Manufacture of the Printing Plate:

The dried plate is now exposed for 6 minutes under a silver negative in a tubular exposure instrument ("Printaphot") of Messers. Photoclark, Bonn. This instrument is equipped with 6 superactinic fluorescent tubes of Messers. Philips (Type TLA 20 W/05) and a 4 mm. thick glass cover plate. The fluorescent tubes are at a distance of about 7 cm. from the copying layer. The exposed plate is dipped for 2 minutes into a developer solution of a mixture of 20 ml. of cyclohexanone, 50 ml. of chlorobenzene and 30 ml. of butylacetate, rinsed with fresh developer and dried.

A positive resist image results. The exposed metal surface is subsequently etched with 5 percent strength by weight nitric acid and a positive relief plate is obtained.

Example 2 a. Manufacture of a photo-cross-linkable ester:

28.2 g. of a dried polyvinyl alcohol of which a 4 percent strength by weight aqueous solution shows a viscosity of 4 cp./20° C., and which has a degree of saponification of 88 percent, are swollen in 1,000 ml. of pyridine overnight at 100° C., 1.0 g. of diazabicyclooctane is then added, and a solution of 108 g. of cinnamylidene cyanacetic acid chloride in 200 ml. of dioxane is added dropwise over the course of 3 hours at 50° to 55° C. The mixture is stirred for a further 5 hours at this temperature, allowed to stand overnight at 20° C., and the pyridinium chloride is filtered off. The filtrate is allowed to run into 8,000 ml. of water while stirring, the mixture is stirred for a further hour, and the product is filtered off and thoroughly rinsed with 10,000 ml. of water. After drying under reduced pressure (2 hours at 50° C.) and over $P_2O_5$ (overnight at 25° C.) 93 g. of a fibrous light yellow product are obtained which is completely soluble in dioxane and which in the UV-spectrum shows a maximum at 341 mμ with an extinction of $E^{1\%}_{1 cm.}=1,125$ (dioxane).

b. Manufacture of the Copying Material:

A bimetallic plate consisting of an aluminum support and a thin copper layer is coated on the copper surface with a 5 percent strength by weight solution of the polyvinyl-cinnamylidene-α-cyanacetate manufactured according to (a) in dioxane, using a centrifugal coater at 100 revolutions per minute. The layer is first superifically dried with a warm air blower and then postdried for 2 minutes at 100° C.

c. Manufacture of the Printing Plate:

The sensitized plate is exposed, under the conditions specified in example 1(c), under a screen negative for 6 minutes and developed by dipping in dioxane. As soon as the unexposed areas of the copying layer have dissolved, the plate is sprayed down with fresh dioxane, subsequently dipped in ethanol and finally dried. The exposed parts of the copper layer are now worn away down to the aluminum support by treatment with a copper etching liquid consisting of a mixture of 50 percent by weight of water, 45 percent by weight of iron-III nitrate and 5 percent by weight of calcium acetate. Thereafter the cross-linked copying layer is wetted with dimethylformamide and rubbed down. The printing plate is now wiped over with 1 percent strength by weight phosphoric acid and inked with a greasy ink. A positive printing plate results which is capable of producing very long printing runs.

Example 3

A trimetallic plate (aluminum/copper/chromium is coated on the chromium surface with a 5 percent strength by weight solution of the polyvinylcinnamylidene-α-cyanacetate obtained according to example 2(a), under the conditions described under example 2(b), and the layer is dried on.

The plate sensitized in this manner is exposed for 6 minutes under a screen positive under the conditions specified in example 1(c).

Development is effected as in example 2(c). The chromium layer is thereafter dissolved away, down to the copper layer, in the parts not covered by cross-linked copying layer by treatment with a commercial chromium etching liquid, for example an aqueous solution containing 30 percent by weight of $CaCl_2$, 20 percent by weight of $ZnCl_2$ and 1.5 to 3 percent by weight each of $NH_4Cl$, tartaric acid and concentrated hydrochloric acid.

In order to remove the copying layer cross-linked by light, the plate is wetted with dimethylformamide and rubbed down, with the conjoint use of a little whiting being of advantage. Care must be taken that the cross-linked copying layer is entirely removed.

The plate is thereafter rubbed down with dilute sulphuric acid (5 percent strength by weight) and inked with a greasy ink. A positive printing plate results which is suitable for the manufacture of prints in very long runs.

Example 4

A 2 mm. thick zinc plate the surface of which has been lightly roughened according to example 1(b) is coated on a centrifugal plate coater with a solution which has been prepared from 7 g. of the polyvinylcinnamylidene-α-cyanacetate manufactured according to example 2(a), 0.35 g. of Crystal Violet (Color Index 42555) and 92.65 g. of dioxane and which has been freed by filtration from dyestuff particles which remained undissolved.

The coated plates can, before further use, be stored for a long time without becoming unusable; for example, plates can still be processed perfectly after 8 weeks storage at +42° C. and 70 percent relative humidity.

The coated plates are exposed under a negative with the light source specified in example 1(c). A light image contrast results.

Development is effected by dipping or spraying with dioxane and after the actual development the plate is briefly sprayed with fresh dioxane or with ethanol and then dried.

An etching resist, colored in a strong blue and possessing high image sharpness, results which without burning in shows high resistance towards the etching agent (nitric acid and flank protection agent) during the subsequent single-stage etching process.

Instead of Crystal Violet it is also possible to use the same amount of Zapon Fast Blue FLE (CI 74400) or Zapon Fast Violet BE (CI 12196) in the copying layer.

For the coating operation, a mixture of ethylene glycol monomethyl ether acetate and cyclohexanone (weight ratio 6:4 to 8.5:1.5) can also be successfully used as the solvent. A mixture of 50 ml. of chlorobenzene, 30 ml. of butyl acetate and 20 ml. of cyclohexanone is particularly suitable for use as a developer.

When using this mixture the plate can, taking appropriate care, also be developed manually on a developing table, with the plate being wiped over with a swab moistened with the developer until the copying layer has been removed in the unexposed zones; thereafter the plate is briefly wiped over with a fresh swab moistened with developer, thoroughly rinsed down with ethanol or water and dried.

When developing the plate manually on a developing table benzyl alcohol is also very suitable as a developer.

Example 5 a. Manufacture of the photo-cross-linkable ester:

28.2 g. of a dried polyvinyl alcohol of which a 4 percent strength by weight aqueous solution has a viscosity of 4 cp./20° C. and which has a degree of saponification of 88 percent are swollen overnight in 1,000 ml. of pyridine at 100° C. 2 g. of diazabicyclooctane are added and a solution of 75.6 g. of cinnamylidene cyanacetic acid chloride in 180 ml. of dioxane is added dropwise over the course of 3 hours to the mixture kept at 50° to 55° C. The mix is kept at this temperature for a further 5 hours, allowed to stand overnight at 20° C., and precipitated salts are then filtered off. The filtrate is allowed to run into 8,000 ml. of water while stirring and after stirring for 1 hour the product is filtered off, rinsed with 10 1. of water and dried. Eighty-four g. of a fibrous product are obtained which in the UV-spectrum shows a maximum at 341 mμ with an extinction of $E^{1\%}_{1\,cm.} = 1{,}120$ (dioxane).

b. Manufacture of the Copying Material:

The procedure of example 1(b) is followed but a 7 percent strength by weight solution of the polyvinylcinnamylidene-α-cyanacetate, which is photo-cross-linkable, obtained according to (a) in a mixture of ethylene glycol monomethyl ether acetate and cyclohexanone (volume ratio 1:1) is used for the coating.

c. Manufacture of the Printing Plate:

The image exposure and development are carried out as in example 1(c) and yield a good etching resist. A relief printing plate is obtained by treatment with 5 percent strength by weight nitric acid.

Example 6 a. Manufacture of the photo-cross-linkable ester:

2.82 g. of a dried polyvinyl alcohol of which a 4 percent strength by weight aqueous solution has a viscosity of 8 cp./20° C. and which has a degree of saponification of 88 percent are swollen overnight at 100° C. in 50 ml. of pyridine, 50 ml. of pyridine and 0.1 g. of diazabicyclooctane are then added and 10.8 g. of cinnamylidenecyanacetic acid chloride are introduced in portions at 50° to 55° C.; thereafter the mixture is stirred for 8 hours at this temperature, allowed to stand overnight, mixed with 50 ml. of acetone and filtered, and the filtrate is allowed to run into 3,000 ml. of water while stirring, stirred for a further 1 hour, filtered off and thoroughly washed with 3,000 ml. of water. After drying (2 hours at reduced pressure at 50° C., then overnight at 25° C. over $P_2O_5$) 7.5 g. of a fibrous yellowish-white product are obtained of which the UV-spectrum shows a maximum at 343 mμ with an extinction of $E^{1\%}_{1\,cm.} = 1{,}076$ (dioxane).

b. Manufacture of the Copying Material:

The procedure of example 5(b) is followed. The coating is however effected with a 7 percent strength by weight solution of the polyvinylcinnamylidene-α-cyanacetate manufactured according to (a) in a mixture of equal parts by volume of ethylene glycol monomethyl ether acetate and cyclohexanone.

c. Manufacture of the Printing Plate:

Exposure and development are effected as in example 5(c). A relief printing plate is obtained by treatment with 5 percent strength by weight nitric acid.

Example 7 a. Manufacture of the photo-cross-linkable ester:

The procedure of example 2(a) is followed. The polyvinyl alcohol type employed for the acylation however has a viscosity of 20 cp. at 20° C. in the form of a 4 percent strength by weight solution in water, and the degree of saponification is 88 percent. The UV-spectrum of the photo-cross-linkable ester shows a maximum at 345 mμ with an extinction of $E^{1\%}_{1\,cm.} = 982$.

b. Manufacture of the Copying Material:

The procedure of example 5(b) is followed. However a solution of the polyvinyl-α-cyanocinnamylidene acetate obtained according to (a) is used. The concentration of the coating solution is 7 percent and a mixture of equal volumes of ethylene glycol monomethyl ether acetate and cyclohexanone is used as the solvent.

c. Manufacture of the Printing Plate:

Exposure, development and treatment with dilute nitric acid is effected as in example 5(c). A relief printing plate is obtained.

Example 8

An aluminum surface of an instrument casing, roughened by metal brushes, is coated with a 4 percent strength by weight solution of the photo-cross-linkable ester of which the manufacture is described in example 2(a), and the layer is dried on.

The negative of the inscription which is to be applied is laid on the surface and weighed down with a glass plate. After exposure under a carbon arc lamp (6 minutes) development is effected by spraying with a mixture of 20 ml. of cyclohexanone, 50 ml. of chlorobenzene and 30 ml. of butyl acetate and the layer is dried. It is then treated with an 0.06 percent strength by weight aqueous sodium metasilicate solution, rinsed with water, rendered acid with 1 percent strength by weight aqueous phosphoric acid, inked with a rapidly drying printing ink and dried. The inscription applied in this way can, together with the noninscribed aluminum surface, be protected by laminating a film onto it or by a lacquer coating.

Example 9 a. Manufacture of the photo-cross-linkable ester:

4.52 g. of a dried polyvinyl alcohol of which a 4 percent strength by weight solution in a water/methanol mixture (weight ratio 1:1) has a viscosity of 5.95 cp./20° C. and which has a degree of saponification of 65 percent are swollen overnight at 100° C. in 100 ml. of anhydrous pyridine; after cooling to 50° C. 0.1 g. of diazabicyclooctane are added and a solution of 10.8 g. of cinnamylidenecyanacetic acid chloride in 25 ml. of dioxane is subsequently added dropwise at this temperature over the course of 1 hour; the mixture is finally stirred for a further 7 hours at 50° C. and left to stand overnight at 20° C. The mixture is filtered and the filtrate is allowed to run into 2,000 ml. of water while stirring, stirred for a further 1 hour, filtered off, thoroughly rinsed with about 2,000 ml. of water, and dried for 2 hours at 50° C. under reduced pressure, then overnight over $P_1O_5$. Ten g. of a fibrous light yellow product are obtained which is completely soluble in dioxane and which in the UV-spectrum has a maximum at 343 mμ with an extinction of $E^{1\%}_{1 cm.}$ = 1,060 (dioxane).

b. Manufacture of the Copying Material:

An electrolytically roughened subsequently anodized aluminum foil which is coated with a thin layer of polyvinylphosphonic acid according to the process of German Pat. specification 1,134,093 is coated on a centrifugal coater with a 6 percent strength by weight solution of the photo-cross-linkable ester, manufactured according to (a), in an ethylene glycol monomethyl ether acetate/cyclohexanone mixture (volume ratio 1:1). The coating is dried on with a warm air blower and postdried for 2 minutes at 100° C.

c. Manufacture of the Printing Plate:

The copying material manufactured in this manner is exposed under a screen negative for 1 to 2 minutes by means of a xenon impulse lamp (5 kw., lamp distance 1 m.). For development, the foil is dipped in a mixture of 20 ml. of cyclohexanone, 50 ml. of chlorobenzene and 30 ml. of butyl acetate sprayed with fresh developer and finally with ethanol, and dried.

The foil is now wiped over with the emulsion described in German Pat. specification 1,086,555, example 1, which consists of tetrahydronaphthalene, gum arabic, phosphoric acid and water, rinsed with water and inked with a greasy ink. Using the printing plate manufactured in this way a long printing run is achieved on the usual offset presses without reinforcing the image with one of the usual lacquers.

Example 10

The copying material manufactured according to example 9(b) is exposed under a negative (line drawing) for 2 minutes in a copying frame having a 3.5 mm. thick glass plate, at a distance of 20 cm. from a 200 w. tungsten incandescent lamp. Processing is carried out as in example 9(c). An offset printing plate results with which it is possible to print on the usual offset presses.

A very similar result is achieved if the exposure is effected with sunlight (vertical light incidence, exposure time 5 to 10 seconds).

Example 11

The copying material of which the manufacture is described in example 9(b) is exposed imagewise on a Caps-Jeffree microfilm reenlargement instrument (mercury maximum pressure lamp and glass optics), with a microfilm negative enlarged 1:10 being copied, onto the copying layer.

After exposure of 1 minute the material is developed as described in example 9(c) and inked. A positive printing plate results, by means of which prints can be produced on the usual offset presses.

Example 12 a. Manufacture of the photo-cross-linkable ester:

9.04 g. of an acetylcellulose having an acetyl content of 31.4 percent are swollen overnight at 100° C. in 100 ml. of pyridine, 0.1 g. of diazabicyclooctane are then added and 10.8 g. of cinnamylidenecyanacetic acid chloride are introduced in portions at 50° C.; the mixture is thereafter stirred for a further 8 hours at this temperature, 50 ml. of acetone are added and the mixture is then filtered. The filtrate is allowed to run into 3,000 ml. of water, stirred for a further 1 hour, and the product filtered off, thoroughly washed with water and dried at 30° C. over $P_2O_5$ and under reduced pressure. 3.8 g. of a fibrous white product are obtained of which the UV-spectrum has a maximum at 350 mμ with an extinction of $E^{1\%}_{1 cm.}$ = 235 (dimethylformamide).

b. Manufacture of the Copying Material:

A procedure analogous to example 1(b) is followed but a coating solution is used for the coating which contains the cellulose-cinnamylidene-α-cyanacetate obtained according to (a) and the polyvinyl-α-cyanocinnamylidene acetate manufactured according to example 2(a). The mixing ratio, by weight, of polyvinyl ester: cellulose ester is 7:3. The coating solution contains 7 percent by weight of the two photo-cross-linkable esters, in an ethylene glycol monomethyl ether acetate/cyclohexanone mixture (weight ratio 1:1) as the solvent.

The coating is first dried on under a warm air blower and then postdried for 2 minutes at 85° C.

c. Manufacture of the Printing Plate:

Image exposure takes place under a silver negative (line pattern) for 6 minutes, using the light source described in example 1(c).

After development with the solvent mixture used as the developer in example 9(c) the plate carrying the resist image is dried and etched with 5 percent strength by weight aqueous nitric acid. A relief printing plate is obtained.

Example 13 a. Manufacture of the photo-cross-linkable ester:

2.62 g. of an ethylene/vinyl alcohol copolymer having a residual acetyl content of 2.0 percent and containing 14 percent of ethylene are swollen overnight at 100° C. in 100 ml. of pyridine, 0.1 g. of diazabicyclooctane are added, and 10.8 g. of cinnamylidenecyanacetic acid chloride are introduced in portions at 50° C. The further procedure is analogous to example 12(a). 3.8 g. of a white fibrous product are obtained of which the UV-spectrum shows a maximum at 350 mμ with an extinction of $E^{1\%}_{1 cm.}$ = 645 (dimethylformamide).

b. Manufacture of the Copying Material:

An electrolytically roughened aluminum foil is coated with a mixture which was obtained by dissolving 4 g. of the photo-cross-linkable ester manufactured according to (a), 0.4 g. of a polyvinyl acetate of which a 23 percent strength by weight solution in ethyl acetate has a viscosity of 10 poise, in a mixture of 15 g. of dimethylformamide and 85 g. of ethylene glycol monomethyl ether with the addition of 0.4 g. of highly disperse pure silica (for example ®Aerosil MOX 170). Drying takes place for 2 minutes at 85° C.

c. Manufacture of the Copy:

In order to manufacture a positive single copy the copying layer is exposed for 1 to 2 minutes under a positive by means of the light source described in example 1(c). The exposed material is dipped for 10 seconds in a solution of 1 g. of Fat Black HB (CI 26,150) and is rinsed with water. The dyestuff only penetrates into the unexposed parts of the layer. A bluish-black image on a light background is obtained.

Example 14 a. Manufacture of the photo-cross-linkable ester:

A 40 percent strength by weight solution of an epoxide resin made from bisphenol A and epichlorhydrin, of average molecular weight 80,000, in methyl ethyl ketone is first thoroughly heated in a rotational evaporator and then under an oil pump at a maximum of 100° C.

12.5 g. of the solid product are dissolved hot in 75 ml. of pyridine, 0.075 g. of diazabicyclooctane are then added and 10.8 g. of cinnamylidenecyanacetic acid chloride are introduced in portions at 50° C.; the mixture is thereafter stirred for a further 8 hours at 50° C., filtered and introduced dropwise into 2,000 ml. of water over the course of 30 minutes while stirring. The product, in the form of a fine precipitate, is stirred for a further hour, filtered off, washed with a large amount of water until free of pyridine and subsequently dried at 30° C. under reduced pressure.

Twelve g. of a light fibrous white product are obtained, which is soluble in cold dioxane and which has excellent film-forming properties. Its UV-spectrum shows a maximum at 342 mμ with an extinction of $E^{1\%}_{1\,cm.}$ = 382 (dioxane).

b. Manufacture of the Copying Material:

A zinc plate roughened as in example 1(b) is coated with a solution of the cinnamylidene-α-cyanacetate of an epoxide resin obtained according to (a), the solution having been obtained from 6 g. of this photo-cross-linkable polymer, 0.3 g. of Crystal Violet (CI 42,555) and 94 ml. of dioxane, with undissolved dyestuff particles having been filtered off before the coating operation.

c. Manufacture of the Printing Plate:

After drying on of the layer by means of a warm air blower and 2 minutes' drying at 100° C. the material is exposed for 6 minutes under a line negative by means of the light source described in example 1(c). Development is effected by brief rinsing with dioxane. A relief printing plate is obtained by etching with nitric acid.

Example 15 a. Manufacture of the photo-cross-linkable ester:

2.30 g. of a dried polyvinyl alcohol of which a 4 percent strength by weight aqueous solution has a viscosity of 3.0 cp./20° C. and which has a degree of saponification of 98 percent are swollen overnight at 100° C. with 50 ml. of pyridine, 50 ml. of pyridine together with 0.2 g. of N,N'-tetramethyl-1,4-diaminobutene are then added, and at 50° C. 2.45 g. of 2-ethyl-hexanoic-acid chloride are first added dropwise. 7.6 g. of cinnamylidene-cyanacetic acid chloride are then introduced in portions, and the mixture is stirred at this temperature for a further 8 hours. Fifty ml. of acetone are added, the mixture is then filtered and the filtrate introduced dropwise into 3,000 ml. of water while stirring; the mixture is stirred for a further hour and filtered, and the product is thoroughly rinsed with 3,000 ml. of water, dried for 2 hours at 50° C. under reduced pressure and then dried overnight at 30° C. over $P_2O_5$. 4.35 g. of a fibrous whitish-yellow product are obtained which shows good solubility in dimethylformamide, dioxane and ketones, for example acetone or methyl ethyl ketone. The UV-spectrum shows a maximum at 346 mμ with an extinction of $E^{1\%}_{1\,cm.}$=413 (dimethylformamide).

b. Manufacture of the Copying Material:

An electrolytically roughened aluminum foil is coated with a 4 percent strength by weight solution of the light-sensitive ester manufactured according to (a), in a mixture of dimethylformamide, ethylene glycol monomethyl ether and ethylene glycol monomethyl ether acetate (weight ratio 4:1:1).

c. Manufacture of the Printing Plate:

After drying the layer the foil is exposed for 3 minutes under a line negative using a 5 kw. xenon impulse lamp, developed by bathing in dioxane, and subsequently dried.

An offset printing plate is manufactured by briefly wiping over with 1 percent strength by weight aqueous phosphoric acid to which a few drops of dioxane are added on the development swab, rinsing with water and inking with a greasy ink.

Example 16 a. Manufacture of the photo-cross-linkable ester:

2.82 g. of a dried polyvinyl alcohol, of which a 4 percent strength by weight aqueous solution has a viscosity of 3.9 cp./20° C. and of which the degree of saponification is 88 percent are swollen overnight at 100° C. in 50 ml. of pyridine, 50 ml. of pyridine and 0.1 g. of diazabicyclooctane are then added and 11.1 g. of 3-methoxybenzylidene-cyanacetic acid chloride are added in portions at 50° C.; the mixture is then stirred for a further 8 hours at 50° C. and worked up as in example 6(a). Eleven g. of a product are obtained which in the UV-spectrum shows a maximum at 304 mμ with an extinction of $E^{1\%}_{1\,cm.}$ = 511 (dimethylformamide).

b. Manufacture of the Copying Material:

An electrolytically roughened aluminum foil is coated with a 4 percent strength by weight solution of the polyvinyl-3-methoxybenzylidene-cyanacetate manufactured according to (a), in a mixture of dimethylformamide and ethylene glycol monomethyl ether acetate (volume ratio 25:10).

c. Manufacture of the Copy:

After exposure (3 minutes) by means of the light source described under example 1(c) under a line negative the material is developed by dipping in the developer used in example 1(c) which contains 1 percent by weight of Fat Black HB dissolved therein.

After dissolving away the copying layer which is not cross-linked, the material is rinsed with water.

A bluish-black positive image of the original results.

Example 17 a. Manufacture of the photo-cross-linkable ester:

A procedure analogous to example 14(a) is followed but an epoxide resin of average molecular weight 200,000 is employed as the starting material.

b. Manufacture of the Copying Material:

A polyethylene terephthalate film roughened by sand blasting is coated with a mixture which was prepared as follows:

2.8 g. of Heliogen Blue B (CI 74160) are finely ground on a ball mill in 100 ml. of a mixture of equal parts by volume of cyclohexanone and ethylene glycol monomethyl ether acetate. Seven g. of the cinnamylidene-α-cyanacetate of a high molecular epoxide resin, manufactured according to (a), are now added and the mixture is stirred until the polymer has dissolved.

c. Manufacture of the Copy:

The copying layer is exposed for 6 to 9 minutes under a line negative by means of the light source described in example 1(c). Thereafter it is developed by dipping into dioxane and carefully wiping over with a cottonwool swab. It is finally sprayed down with water and dried. A deep blue positive tanned image results.

Example 18 a. A 2 mm. thick copper plate is coated on a centrifugal plate coater with a 7 percent strength by weight solution of the photo-cross-linkable ester, manufactured according to example 2(a) in an ethylene glycol monomethyl ether acetate/cyclohexanone mixture (volume ratio 1:1). Drying: 2 minutes at 100° C. in a drying cabinet.

The image exposure takes place under the conditions specified in example 1(c), under a screen positive (coarse screen) (duration: 6 minutes).

Development takes place by dipping in a mixture of 50 ml. of chlorobenzene, 20 ml. of cyclohexanone and 30 ml. of butyl acetate. Thereafter the material is etched by soaking in a 40 percent strength by weight iron-III chloride solution until the copper has been etched away to the requisite depth in the parts not protected by the layer cross-linked by light. The material is now rinsed with water and the hardened copying layer is rubbed down with a little dimethylformamide. A halftone gravure plate results.

Naturally, a relief printing plate can also be obtained from the sensitized copper plate if it is appropriately processed.

b. Instead of the photo-cross-linkabe ester used under (a) an ester manufactured as follows is used in the same procedure:

4.36 g. of a dried polyvinyl alcohol of which a 4 percent strength by weight solution in a water/methanol mixture (weight ratio 1:1) has a viscosity of 9.51 cp./20° C. and which has a degree of saponification of 66.5 percent are swollen in 100 ml. of pyridine overnight at 100° C., 0.1 g. of diazabicyclooctane are added, and a solution of 10.8 g. of cinnamylidene-α-cyanacetic acid chloride in 25 ml. of dioxane is added at 50° C. over the course of 1 hour; the mixture is then stirred for a further 7 hours at this temperature, is allowed to stand at room temperature overnight, and insoluble matter is filtered off. The filtrate is introduced dropwise into 1,000 ml. of water over the course of 30 minutes and the mixture is stirred for a further hour, and the precipitate is filtered off, thoroughly rinsed with 1,000 ml. of water and dried.

9.5 g. of a fibrous whitish-yellow product are obtained of which the UV-spectrum shows a maximum at 342 mμ with an extinction of $E^{1\%}_{1 cm.}$ = 1,050 (dioxane).

A line original (printed text) serves as the copying original when using this photo-cross-linkable ester.

Example 19 a. Manufacture of the photo-cross-linkable ester:

5.07 g. of a dried polyvinyl alcohol of which a 4 percent strength by weight solution in a water/methanol mixture (weight ratio 1:1) has a viscosity of 9.62 cp./20° C. and which has a degree of saponification of 60 percent are swollen overnight at 100° C. in 100 ml. of pyridine, 0.1 g. of diazabicyclooctane are added and a solution of 10.8 g. of cinnamylidene-α-cyanacetic acid chloride in 25 ml. of dioxane is added dropwise at 50° C. over the course of 1 hour; the mixture is then stirred for a further 7 hours at 50° C., allowed to stand overnight at room temperature, and insoluble matter is subsequently filtered off. The photo-cross-linkable ester is separated off as in example 18(b).

Ten g. of a fibrous whitish-yellow product are obtained which is soluble in dioxane and of which the UV-spectrum shows a maximum at 341μ with an extinction of $E^{1\%}_{1 cm.}$ = 955 (dioxane).

b. Manufacture of the Copying Material:

A plastic plate laminated with a copper foil is coated on the copper layer with a 7 percent strength by weight solution of the photo-cross-linkable ester manufactured according to (a) in an ethylene glycol methyl ether acetate/cyclohexanone mixture (volume ratio 1:1) on a centrifugal plate coater (100 revolutions per minute), and the coating is dried on (2 minutes at 100° C.).

c. Manufacture of a Printed Circuit:

The material is exposed under the conditions specified in example 1(c) under a silver negative of a circuit. The development and etching are carried out as in example 18(A). Etching is continued until the copper is completely removed from the areas not covered by the etching resist. A printed circuit results.

If desired, the hardened copying layer can be removed by wetting with dimethylformamide and rubbing down.

Example 20 a. Manufacture of the photo-cross-linkable ester:

7.11 g. of a polyvinyl alcohol of which a 4 percent strength by weight solution in a water/methanol mixture (weight ratio 1:1) has a viscosity of 14.52 cp./20° C. and which has a degree of saponification of 46.7 percent, are swollen overnight at 100° C. in 100 ml. of pyridine, 0.1 g. of diazabicyclooctane are added and a solution of 10.8 g. of cinnamylidene α-cyanacetic acid chloride in 25 ml. of dioxane is added over the course of 1 hour at 50° C.; the mixture is then stirred for a further 7 hours at this temperature and is left to stand overnight at room temperature. It is worked up analogously to example 18(B) and 12 g. of a fibrous whitish-yellow product are obtained of which the UV-spectrum has a maximum at 345μ with an extinction of $E^{1\%}_{1 cm.}$ = 630 (dioxane).

b. Manufacture of the Copying Material:

A brass plate coated with a thin chromium layer is coated on a centrifugal plate coater (100 revolutions per minute) with a 7 percent strength solution of the photo-cross-linkable ester, obtained according to (a), in an ethylene glycol methyl ether acetate/cyclohexanone mixture (volume ratio 1:1) and the coating is dried on (2 minutes at 100° C.).

c. Manufacture of the Printing Plate:

The further processing (development, etching and decoating) is carried out as in example 3, with the sole variation that a mixture of 50 ml. of chlorobenzene, 20 ml. of cyclohexanone and 30 ml. of butyl acetate is used as the developer.

A bimetallic plate capable of yielding long printing runs is obtained, in which brass serves as the ink-transferring metal.

Example 21

An aluminum foil finely roughened by metal brushes is coated on a centrifugal plate coater with a 6 percent strength by weight solution of the photo-cross-linkable ester, manufactured according to example 2(a), in dioxane. Drying is first effected by a warm air blower and then for 1 minute at 85° C.

Exposure takes place under a line positive in the arrangement specified in example 1(c) (duration: 6 minutes). After development with a mixture of 50 ml. of chlorobenzene, 20 ml. of cyclohexanone and 30 ml. of butyl acetate the material is dried. The metal laid bare is surface-etched and copper-plated in accordance with the process of German displayed specification 1,224,147, example 5. The layer is removed by rubbing down with dimethylformamide. The aluminum surface laid bare is rendered hydrophilic by treatment with dilute phosphoric acid (1 percent strength by weight). A positive planographic printing plate results.

Example 22

A fine nylon fabric of the quality which is usual for the manufacture of screen printing forms is coated with a 33 percent strength by weight solution of the photo-cross-linkable polymer, used in example 21, in dioxane, and the coating is dried.

After exposure under a line positive (6 minutes) the unexposed layer is removed by spraying down with the developer used in example 21. A screen printing form results from which positive prints are obtained.

Example 23

A brushed aluminum foil is coated with a solution which contains 3 g. of the photo-cross-linkable ester used in example 21 and 3 g. of the sulphonyliminoquinone diazide described in German Pat. specification 1,104,834 (compare formula 1) in a mixture of 50 ml. of ethylene glycol methyl ether acetate and 50 ml. of cyclohexanone. After exposure under a screen negative by means of a 5 kw. xenon impulse lamp (4 minutes) the material is briefly sprayed with the developer used in example 21, dried, wiped over with the emulsion described in German Pat. specification 1,086,555, example 1, rinsed with water and inked with a greasy ink.

A positive planographic printing plate results which possesses good resistance towards aqueous sodium silicate solution.

If the coating is carried out with a coating solution which consists of 0.2 g. of the photo-cross-linkable ester used in example 21, 0.8 g. of the above-mentioned sulphonyliminoquinone diazide in 100 ml. of the above solvent mixture, then a copying material is obtained which can, after imagewise exposure, be developed with aqueous alkali, for example with the developers named in German displayed specification 1,193,366 or with 1 percent strength by weight sodium metasilicate solution. The copying layer obtained with the addition of the photo-cross-linkable ester yields exposure products which show better resistance to the developer than shown by layers without this additive.

Example 24 a. Manufacture of the photo-cross-linkable ester:

2.28 g. of a dried polyvinyl alcohol of which a 4 percent strength by weight aqueous solution has a viscosity of 15.4 cp./20° C. and of which the degree of saponification is 88 percent are swollen overnight in 50 ml. of pyridine at 100° C., 50 ml. of pyridine and 0.1 g. of diazabicyclooctane are added and 11.5 g. of p-isopropyl-benzylidenecyanacetic acid chloride are added at 50° C. in portions; the mixture is then stirred for a further 8 hours at this temperature and worked up as in example 6(a). After reprecipitation from a dioxane/water mixture (weight ratio 1:1), washing and drying, 2.9 g. of a white fibrous product are obtained which in the UV-spectrum shows a maximum at 317$\mu$ with an extinction of $E^{1\%}_{1 cm.}$ = 587 (dimethylformamide).

b. Manufacture of the Copying Material:

The procedure of example 8 is followed; the aluminum casing surface intended for coating is however electrolytically roughened and coated with a 4 percent strength by weight solution of the photo-cross-linkable ester, manufactured according to (a), in a mixture of dimethylformamide/ethylene glycol monomethyl ether/ethylene glycol monomethyl ether acetate (volume ration 20:5:5).

c. Manufacture of the Copy:

Exposure is carried out under a 5 kw. xenon impulse lamp (8 minutes) under a negative of the inscription which is to be applied. Development takes place by carefully wiping over and rinsing with dioxane. After the dry plate has been rendered hydrophilic with dilute phosphoric acid (1 percent strength by weight), the inscription copied onto it is rendered visible in the manner specified in example 8.

Example 25 a. Manufacture of the photo-cross-linkable ester:

4.08 g. of a polyvinyl butyral of which the acetal content is 70 percent, the acetate content 1 percent, the polyvinyl alcohol content 25 percent and the dry solids content 98 percent, and of which a 6 strength by weight solution in methanol has a viscosity of 5 cp./20° C., together with 2.60 g. of cinnamylidene-$\alpha$-cyanacetic acid chloride are swollen and partially dissolved in 25 ml. of dioxane at room temperature. With stirring 0.8 g. of pyridine and 0.23 g. of diazabicyclooctane dissolved in 15 ml. of dioxane are added dropwise over the course of 10 minutes at this temperature, and the mixture is then stirred for a further hour and left to stand overnight. The emulsion is thereafter introduced dropwise into 300 ml. of water while stirring vigorously. The product is filtered off, the residue is dissolved in a little cold dioxane, the solution is filtered and added dropwise to 1,200 ml. of water while stirring vigorously, and the mixture stirred for a further hour. After filtering, the product is thoroughly rinsed with water and dried in a reduced pressure drying cabinet at 30° C. 4.7 g. of a light yellow product are obtained of which the UV-spectrum shows a maximum at 330$\mu$ with an extinction of $E^{1\%}_{1 cm.}$=405 (dimethylformamide).

b. Manufacture of the Copying Material:

A 6.5 percent strength by weight solution of the photo-cross-linkable ester, manufactured according to (a), in tetrahydrofurane is cast onto an electrolytically roughened aluminum foil and the coating is dried on. A 30$\mu$ thick coating results.

c. Manufacture of the Copy:

After 20 minutes' exposure by means of a 5 kw. xenon impulse lamp under a line negative the parts of the layer not struck by light are dissolved away by dipping in tetrahydrofurane. A yellowish-colored positive relief image results after drying.

Example 26

A stainless steel plate (for example Thermax steel type 11*a*, material No. 4811) covered with a dark-colored scale layer is lightly rubbed down with a mild abrasive, rinsed with water, dried, rinsed with trichlorethylene, again dried and finally coated with a 10 percent strength by weight solution of the photo-cross-linkable ester used in example 18. The coating is first dried on with a warm air blower and then for 1 minute at 100° C.

The material is then exposed for 10 minutes under a line positive under the conditions specified in example 1(c) and is developed as in example 18(A).

The developed plate is subsequently divided into 2 parts, which are connected to the two poles of a transformer and dipped in 10 percent strength by weight hydrochloric acid. The material is now electrolytically etched for 10 minutes by application of an alternating voltage of 3 volts, and is then rinsed with water and dried. The copied information is engraved into the stainless steel in this manner. Type shields or nameplates of high chemical and thermal stability are for example obtained.

Example 27

A 7 percent strength by weight solution of the polyvinylcinnamylidene-$\alpha$-cyanacetate manufactured according to example 2(a) in a mixture of ethylene glycol monomethyl ether acetate and cyclohexanone (volume ratio 85:15) is used, directly after manufacture and then again after 5 weeks' storage at 50° C. under the conditions mentioned in example 3 to manufacture a relief printing plate. The stored solution also yields perfect, results. It is possible to store the photo-cross-linkable esters used in accordance with the invention for prolonged periods before use in the form of a solution, even under unfavorable conditions.

Example 28

A. Manufacture of the photo-cross-linkable ester:

Fifty g. of an epoxide resin having an epoxide equivalent of 4,000 and a hydroxyl value of 0.40 are comminuted in a mortar and ground with 0.77 g. of hexahydrophthalic anhydride. Thereafter the mixture is cured for 1 hour at 150° to 160° C. on an aluminum sheet, cooled and powdered.

12.5 g. of the resulting product are dissolved in 75 ml. of hot pyridine, 0.075 g. of diazabicyclooctane are added, and 10.8 g. of cinnamylidenecyanacetic acid chloride are added in portions at 50° C.; the mixture is then stirred for a further 8 hours at 50° C., filtered and added dropwise over the course of 30 minutes to 2,000 ml. of water while stirring. The product which has precipitated in the fine form, is stirred for a further hour, filtered off, washed with a large amount of water until free of pyridine and subsequently digested with 50 ml. of methanol. The product is filtered off and dried at 30° C. under reduced pressure. 14.2 g. of a loose white product are obtained of which the UV-spectrum shows a maximum at 350$\mu$ with an extinction of $E^{1\%}_{1 cm.}$= 164 (dimethylformamide) On the basis of its IR-spectrum the product still shows excess free epoxide groups (1230 (s), 830 (s), 890 (w) cm.$^{-1}$). It is soluble in organic solvents such as cyclohexanone or dimethylformamide.

b. Manufacture of the Copying Material:

Baryta paper is coated with 10 percent strength solution of the light-sensitive ester obtained according to (a), and the coating is dried on (solvent: ethylene glycol methyl ether acetate/cyclohexanone in a volume ratio of 1:1).

c. Manufacture of the Printing Plate:

The material is exposed for 6 minutes under a line positive under the conditions specified in more detail in example 1(c). The exposed paper is now dipped for 10 to 20 seconds in a mixture of 9 ml. of diethyl ether and 1 ml. of chlorobenzene, air is blown over it very briefly to evaporate the ether, and the material is pressed onto an electrolytically roughened aluminum foil without delay. After 10 seconds the paper is pulled off. The unexposed areas of the coating have been transferred to the aluminum foil and they are dried on and optionally burned in and/or cross-linked by brief exposure to heat or ultraviolet rays. After wiping over with one of the usual hydrophilizing agents the material is inked with a greasy ink. A positive offset printing plate results.

The image receiving material used can also be a different support suitable for such transfer processes, for example a sheet of paper having a lithographic surface.

Example 29

A clear polyethylene terephthalate film is treated for 3 minutes with a 50 percent strength by weight aqueous solution of trichloracetic acid at room temperature, thoroughly rinsed with water and dried. The film treated in this way is coated with a 6 percent strength by weight solution of the photo-cross-linkable polymer manufactured according to example 2(a) and the coating is dried on.

The copying layer is now exposed for 3 minutes through the support under a genuine halftone positive, in the copying device described in example 1(c). Thereafter the copying material is dipped for 30 seconds into a 1 percent strength by weight solution of Fat Black HB (CI 26150) in a chlorobenzene/butyl acetate/cyclohexanone mixture (volume ratio 5:3:2) and dried. The excess dyestuff is removed with the emulsion described in German Pat. specification 1,086,555, example 1.

A positive halftone copy results.

Example 30

In order to manufacture a relief printing plate based on zinc, using a line original, the procedure of example 12(c) is followed; however, the coating is carried out with a coating solution which contains the photo-cross-linkable ester manufactured according to example 2(a) mixed with a low molecular photo-cross-linkable ester which is manufactured according to example 14(a) using an epoxide resin having an epoxide equivalent weight of 2,400 to 4,000. The UV-spectrum of this ester shows a maximum at 346$\mu$ with an extinction of $E^{1\%}_{1 cm.}$ = 382 (dioxane).

The mixing ratio of the esters is 8:2 (be weight). The coating solution contains the photo-cross-linkable esters in a total concentration of 7 percent by weight in an ethylene glycol monomethyl ether acetate/cyclohexanone mixture (volume ratio 1:1).

What is claimed is:

1. A photo or light-sensitive film element comprising a layer which consists of an esterification product of a polyhydric alcohol and an unsaturated carboxylic acid, which acid possesses at least one carbon-carbon double bond conjugated with its carboxyl group, wherein said layer comprises at least one photo-cross-linkable ester of $\beta$-substituted $\alpha$-cyanacrylic acid and a polyfunctional aliphatic or araliphatic hydroxyl compound, of which hydroxy compound the carbon chain may be interrupted at least once by an oxygen atom, an alkylamino, acetal, ester, carbonic acid ester, urethane, amido or urea group or be bridged at least once by an acetal group, said ester having an average molecular weight of 500 to 5,000,000 and containing a. the group

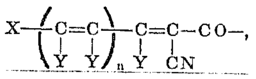

in which Y denotes a hydrogen atom or an aliphatic alkyl residue having one to four carbon atoms, X denotes an aromatic, cycloaliphatic or heterocyclic residue in each containing five to 14 ring members which may be substituted once or twice by an alkyl or alkoxy residue having from one to six carbon atoms, a halogen atom, a phenyl residue, a dialkylamino group of which the alkyl residues each contain one to four carbon atoms, a methylenedioxy, carboxyl or carboxylate group, and *n* denotes 0 or an integer from 1 to 3, wherein (a) in said ester is in an amount from 10 to 100 percent;

b. the group R'—COO—, in which R' denotes an aliphatic residue having one to eight carbon atoms or an aromatic residue having seven to 10 carbon atoms, wherein (b) in said ester is in an amount of from 0 to 85 percent; and c. free hydroxyl groups wherein (c) in said ester is in an amount from 0 to 50 percent, with the groups mentioned under (a) to (c) adding up to 100 percent.

2. A layer as defined in claim 1 and wherein the ester is a photo-cross-linkable ester of an unsubstituted or a nuclear-substituted benzylidene-$\alpha$-cyanacetic or a photo-cross-linkable ester of a cinnamylidene-$\alpha$-cyanacetic acid and a polyfunctional hydroxyl compound.

3. A layer as defined in claim 10 wherein the photo-cross-linkable ester is derived from an acid of the formula

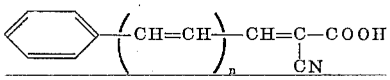

in which *n* denotes 0 or 1, and a polyfunctional hydroxyl compound and wherein the ester is of an average molecular weight from 5,000 to 2,000,000.

4. A layer as defined in claim 1 and wherein a polyvinyl alcohol is used as a polyfunctional hydroxyl compound.

5. A layer as defined in claim 4 and wherein the polyvinyl alcohol has a degree of saponification from 45 to 99 percent, has a 4 percent strength by weight in solution in water or in a water/methanol mixture (weight ratio 1:1) and has a viscosity of 2 to 25 cp./20° C.

6. A layer as defined in claim 1 wherein poly(vinyl alcohol/vinyl ester) or poly(vinyl alcohol/ethylene is used as a polyfunctional hydroxyl compound.

7. A layer as defined in claim 1 and wherein a polyfunctional aliphatic-aromatic ether-alcohol is the polyfunctional hydroxyl compound.

8. A layer as defined in claim 1 and wherein cellulose or partially acylated cellulose is the polyfunctional hydroxyl compound.

9. A layer as defined in claim 1 and wherein a condensation product of bisphenol A and epichlorhydrin is used as the polyfunctional hydroxyl compound.

* * * * *